US009766589B2

(12) United States Patent
Lee et al.

(10) Patent No.: US 9,766,589 B2
(45) Date of Patent: Sep. 19, 2017

(54) MOBILE TERMINAL

(71) Applicant: LG ELECTRONICS INC., Seoul (KR)

(72) Inventors: Yongho Lee, Seoul (KR); Chanyoung Sim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 15/002,288

(22) Filed: Jan. 20, 2016

(65) Prior Publication Data

US 2016/0349708 A1 Dec. 1, 2016

(30) Foreign Application Priority Data

May 28, 2015 (KR) ........................ 10-2015-0075131

(51) Int. Cl.
*H05K 13/04* (2006.01)
*G04B 37/14* (2006.01)
(Continued)

(52) U.S. Cl.
CPC ......... *G04B 37/1486* (2013.01); *G04B 47/06* (2013.01); *G04G 17/04* (2013.01); *G04G 17/045* (2013.01); *G04G 21/00* (2013.01)

(58) Field of Classification Search
CPC ...... G06F 1/163; G06F 1/1652; G06F 1/1626; G06F 1/1633; G06F 1/1637; G06F 1/26;
(Continued)

(56) References Cited

U.S. PATENT DOCUMENTS 1,851,823 A * 3/1932 Fassnacht ................ A44C 5/08 24/331
6,619,836 B1 * 9/2003 Silvant ................... G04G 17/08 368/281
(Continued)

FOREIGN PATENT DOCUMENTS

EP 1852029 11/2007
KR 10-2011-0008607 1/2011
(Continued)

OTHER PUBLICATIONS

PCT International Application No. PCT/KR2015/006253, Written Opinion of the International Searching Authority dated Feb. 18, 2016, 9 pages.

*Primary Examiner* — James Wu
*Assistant Examiner* — Michael Matey
(74) *Attorney, Agent, or Firm* — Lee, Hong, Degerman, Kang & Waimey

(57) ABSTRACT

Disclosed is a wearable mobile terminal comprising a band unit, wherein the band unit includes a deformation part that is elastic and deformable; a plurality of segments enclosing the band unit, wherein the plurality of segments are movable to cover or expose a portion of the deformation part, the portion covered by the plurality of segments when all of the plurality of segments are arranged to be adjacent to each other and the portion is exposed when at least two of the plurality of segments are arranged to be spaced apart from each other; and a module unit configured to execute a specific function, wherein at least part of the module unit is disposed within the deformation part by being selectively exposed according to an arrangement of the plurality of segments.

16 Claims, 13 Drawing Sheets

(51) Int. Cl.
*G04B 47/06* (2006.01)
*G04G 21/00* (2010.01)
*G04G 17/04* (2006.01)

(58) Field of Classification Search
CPC ..... G06F 3/014; A44C 5/0007; A44C 5/0053; A44C 5/0015; A44C 5/2052; A44C 5/2071; A44C 5/2085; H05K 1/0283; H05K 1/189; H05K 1/028; H05K 1/0393; H05K 1/118; H05K 2201/0133; H05K 2203/1469; H05K 3/326; G04G 17/083; G04G 17/04; G04G 17/08; G04G 9/0064; G04G 17/00; G04G 17/06; G04G 21/08; A63B 2071/0658; A63B 2071/0663; A63B 2220/12; A63B 55/408; F16B 1/00; F16B 2/08
See application file for complete search history.

(56) References Cited

U.S. PATENT DOCUMENTS

| | | | | | |
|---|---|---|---|---|---|
| 6,739,748 | B2 * | 5/2004 | Della Santa | G04B 37/0033 | 368/276 |
| 6,880,364 | B1 * | 4/2005 | Vidolin | A44C 5/025 | 40/633 |
| 7,331,707 | B2 * | 2/2008 | DelValle | A44C 5/0015 | 116/308 |
| 7,618,260 | B2 * | 11/2009 | Daniel | A44C 5/0007 | 24/311 |
| 9,380,949 | B2 * | 7/2016 | Schuessler | A61B 5/02055 | |
| 9,486,042 | B2 * | 11/2016 | Isaacs | A44C 5/24 | |
| 2001/0043514 | A1 * | 11/2001 | Kita | A44C 5/0015 | 368/281 |
| 2005/0193767 | A1 * | 9/2005 | Frank | A44C 5/14 | 63/9 |
| 2013/0120106 | A1 * | 5/2013 | Cauwels | G06F 1/163 | 340/3.1 |
| 2015/0124566 | A1 * | 5/2015 | Lake | G04G 21/08 | 368/10 |
| 2015/0331446 | A1 * | 11/2015 | Oh | G06F 1/163 | 361/679.03 |
| 2016/0077548 | A1 * | 3/2016 | Lim | G06F 1/166 | 361/679.26 |

FOREIGN PATENT DOCUMENTS

| | | |
|---|---|---|
| KR | 10-2015-0026387 | 3/2015 |
| KR | 10-2015-0035232 | 4/2015 |

* cited by examiner

MOBILE TERMINAL

CROSS-REFERENCE TO RELATED APPLICATIONS

Pursuant to 35 U.S.C. §119(a), this application claims the benefit of earlier filing date and right of priority to Korean Patent Application No. 10-2015-0075131, filed on May 28, 2015, the contents of which is incorporated by reference herein in its entirety.

BACKGROUND OF THE INVENTION

1. Field of the Invention

The present invention relates to a mobile terminal provided with a band containing various modules therein.

2. Description of the Conventional Art

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

Meanwhile, the mobile terminal is provided with various kinds of electronic components, and as developments of a wearable device having a small-sized structure have been executed, it may be considered to improve a structural part of the mobile terminal so that various electronic components may be effectively disposed within the mobile terminal.

SUMMARY OF THE INVENTION

It is an object of the present invention to provide a wearable mobile terminal in which various kinds of modules are mounted in a band fixed to a users body.

To achieve these and other advantages and objects of the present invention, there is provided a wearable mobile terminal comprising a band unit, wherein the band unit including: a deformation part that is elastic and deformable, a plurality of segments enclosing the band unit, wherein the plurality of segments are movable to cover or expose a portion of the deformation part, the portion covered by the plurality of segments when all of the plurality of segments are arranged to be adjacent to each other and the portion is exposed when at least two of the plurality of segments are arranged to be spaced apart from each other, and a module unit configured to execute a specific function, wherein at least part of the module unit is disposed within the deformation part by being selectively exposed according to an arrangement of the plurality of segments.

In one embodiment, the mobile terminal may further include a fixing part disposed between facing surfaces of the deformation part and the plurality of segments, wherein the fixing part couples the deformation part and the plurality of segments with each other.

In another embodiment, the mobile terminal may further comprising a flexible circuit board electrically connected to the module unit and disposed in the deformation part.

The deformation part may include an accommodation part in which an overlapped part of the flexible circuit board is accommodated.

The mobile terminal may further include a body part coupled to the band unit, a connection pin formed of a conductive material and rotatably connecting the body part and the band unit, and a contact terminal part rotatably connected to the connection pin and electrically connecting the flexible circuit board with a main circuit board of the body part.

The contact terminal part may include a first contact terminal electrically connecting the flexible circuit board and the connection pin, and a second contact terminal electrically connecting the main circuit board and the connection pin.

In still another embodiment, the module unit may include a power connection part configured to receive power from outside, and the power connection part may include a power terminal electrically connected to an external power source.

At least part of the power terminal may be exposed to one surface of the deformation part.

In still another embodiment, the module unit may include a port part electrically connected to an external device, and configured to enable application of at least one of a power or a data signal through the module unit.

The port part may be disposed to be exposed at a side surface of the deformation part in an exposed manner.

In still another embodiment, the module unit may include a display disposed at one surface of the deformation part, and the display may be configured to output visual information.

The display unit may be formed by an organic light emitting diode (OLED).

In still another embodiment, the module unit may include a camera disposed at a surface of the deformation part, the surface excluding a surface facing a users wrist, and configured to receive image data.

In still another embodiment, at least part of the plurality of segments may be formed of a light-transmissible material.

In still another embodiment, the mobile terminal may further include a frame on which the module unit is mounted, wherein the frame is coverable by the plurality of segments, and a switch unit mounted to each of the plurality of segments, wherein the switch unit is configured to limit movement of the plurality of segments by being coupled to the frame in a state that the plurality of segments are spaced from each other.

The frame may include a through hole disposed at both side surfaces, and the switch unit includes a hook that is configured to be coupled to the through hole in a state that the plurality of segments are spaced from each other.

The mobile terminal may further include a spring unit having one end supported on an inner surface of the plurality of segments, wherein the spring unit is configured to elastically force the hook toward the frame.

The frame may be shaped to form an empty space through which a rear surface of the deformation part is exposed in the state that the plurality of segments are spaced from each other.

BRIEF DESCRIPTION OF THE DRAWING

The present invention will become more fully understood from the detailed description given hereinbelow and accompanying drawings, which are given by illustration only, and thus are not limitative of the present invention, and wherein.

DETAILED DESCRIPTION OF THE PREFERRED EMBODIMENTS

Figure 1:
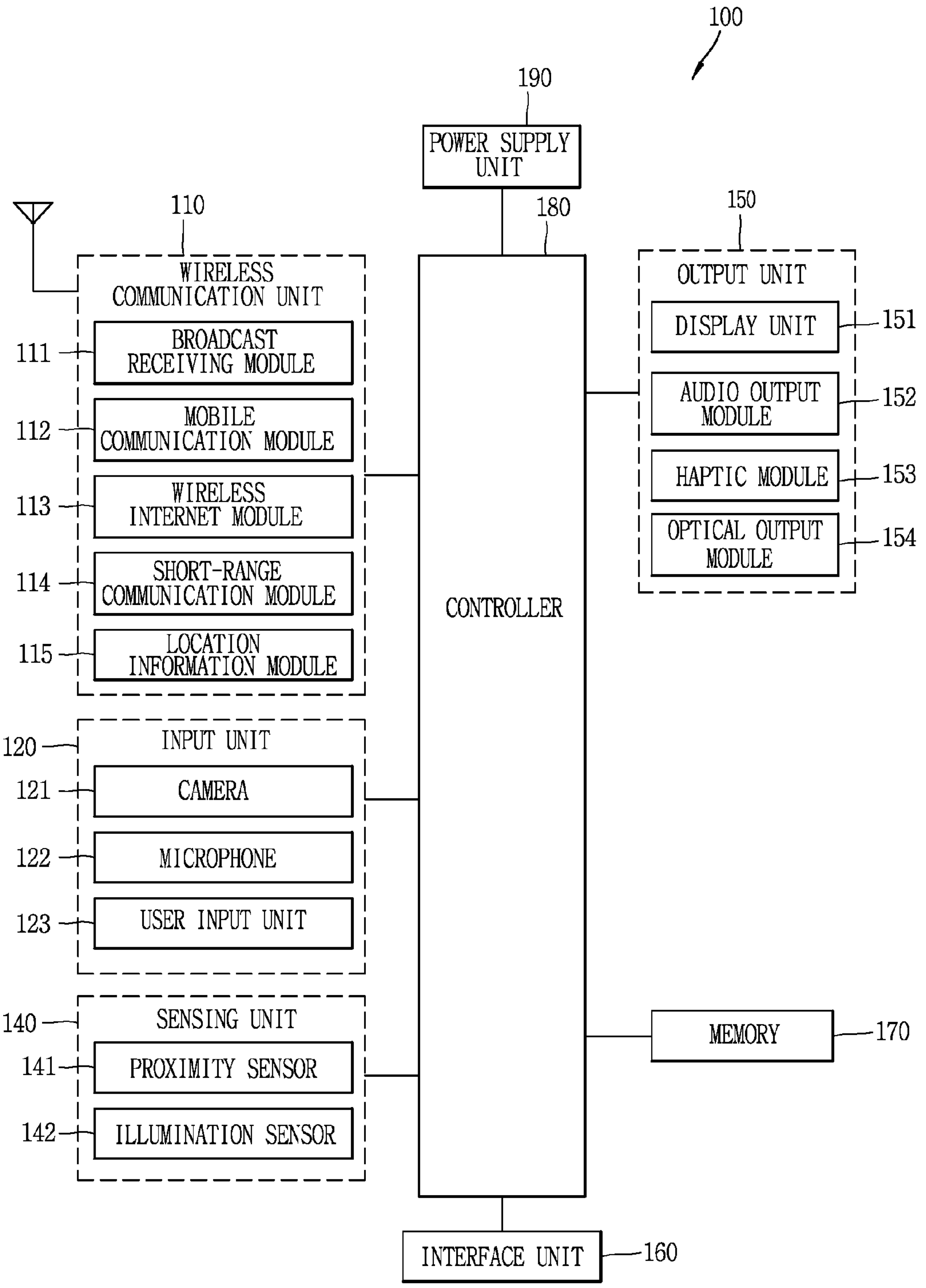
FIG. 1 is a block diagram illustrating a schematic configuration of a mobile terminal according to an embodiment of the present invention.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Reference is now made to FIG. 1, where FIG. 1 is a block diagram of a mobile terminal in accordance with the present disclosure.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

Referring now to FIG. 1, the mobile terminal 100 is shown having wireless communication unit 110 configured with several commonly implemented components. For instance, the wireless communication unit 110 typically includes one or more components which permit wireless communication between the mobile terminal 100 and a wireless communication system or network within which the mobile terminal is located.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks. To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1, the sensing unit 140 is shown having a proximity sensor 141 and an illumination sensor 142.

If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154.

The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output by the various components depicted in FIG. 1, or activating application programs stored in the memory 170. As one example, the controller 180 controls some or all of the components illustrated in FIG. 1 according to the execution of an application program that have been stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Referring still to FIG. 1, various components depicted in this figure will now be described in more detail. Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like). Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (W-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

In some embodiments, another mobile terminal (which may be configured similarly to mobile terminal 100) may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal.

As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module.

The input unit 120 may be configured to permit various types of input to the mobile terminal 120. Examples of such input include audio, image, video, data, and user input. Image and video input is often obtained using one or more cameras 121. Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the mobile terminal, surrounding environment information of the mobile terminal, user information, or the like. The controller 180 generally cooperates with the sending unit 140 to control operation of the mobile terminal 100 or execute data processing, a function or an operation associated with an application program installed in the mobile terminal based on the sensing provided by the sensing unit 140. The sensing unit 140 may be implemented using any of a variety of sensors, some of which will now be described in more detail.

The proximity sensor 141 may include a sensor to sense presence or absence of an object approaching a surface, or an object located near a surface, by using an electromagnetic field, infrared rays, or the like without a mechanical contact.

The proximity sensor 141 may be arranged at an inner region of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like).

In general, controller 180 processes data corresponding to proximity touches and proximity touch patterns sensed by the proximity sensor 141, and cause output of visual information on the touch screen. In addition, the controller 180 can control the mobile terminal 100 to execute different operations or process different data according to whether a touch with respect to a point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151, or convert capacitance occurring at a specific part of the display unit 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180, the controller 180, and combinations thereof.

In some embodiments, the controller 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize position information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121 typically includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors at rows and columns to scan content received at the photo sensor using an electrical signal which changes according to the quantity of applied light. Namely, the photo sensor may calculate the coordinates of the physical object according to variation of light to thus obtain position information of the physical object.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

In some embodiments, the display unit 151 may be implemented as a stereoscopic display unit for displaying stereoscopic images. A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal there through. Various command signals or power input from the cradle may operate as signals for recognizing that the mobile terminal is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a Flash memory, a hard disk, a solid state disk, a silicon disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 may typically control the general operations of the mobile terminal 100. For example, the controller 180 may set or release a lock state for restricting a user from inputting a control command with respect to applications when a status of the mobile terminal meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various exemplary embodiments disclosed herein.

The power supply unit 190 receives external power or provides internal power and supply the appropriate power required for operating respective elements and components included in the mobile terminal 100. The power supply unit 190 may include a battery, which is typically rechargeable or be detachably coupled to the terminal body for charging.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

Figure 2:
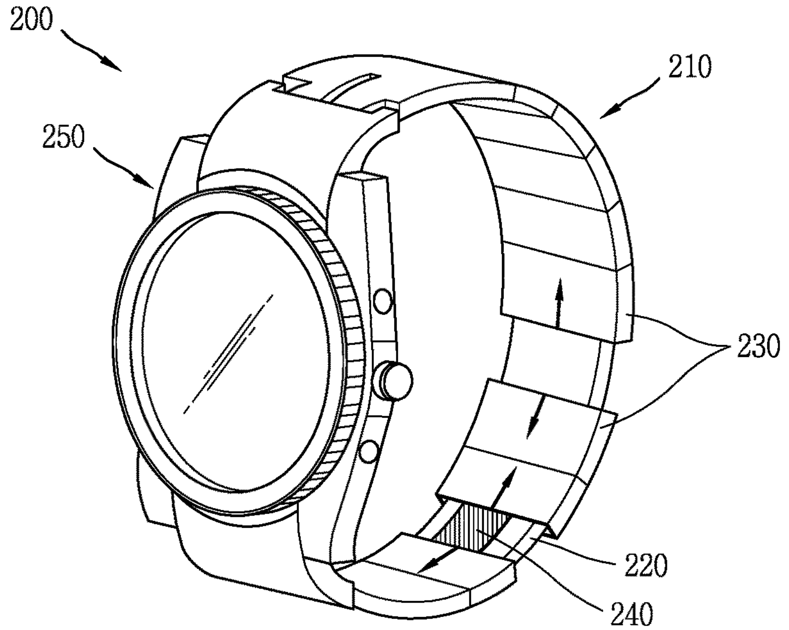
FIG. 2 is a perspective view illustrating a schematic configuration of a mobile terminal according to an embodiment of the present invention.
Figure 3:
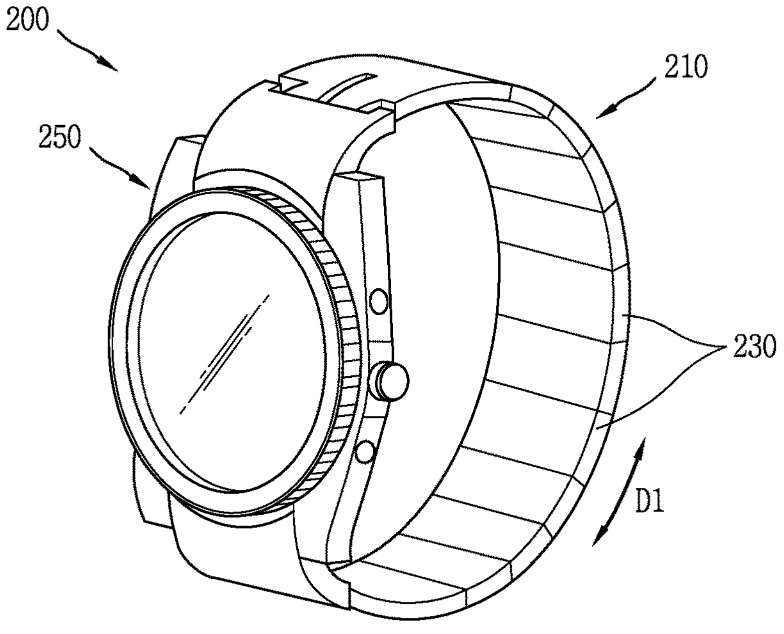
FIG. 3 is a perspective view illustrating a plurality of segments of FIG. 2 which have moved to be adjacent to each other.

FIG. 2 is a perspective view illustrating a configuration of the mobile terminal 200 according to an embodiment of the present invention, and FIG. 3 is a perspective view illustrating a plurality of segments 230 shown in FIG. 2 which have moved to be adjacent to each other.

Referring to FIGS. 2 and 3, the mobile terminal 200 includes a band unit 210 configured to be fastened to a users body. The users body may be one part of the body on which the mobile terminal 200 may be worn.

The band unit 210 may include a deformation part 220, a plurality of segments 230 and a module unit 240.

The deformation part 220 is elastic and deformable. The deformation by elasticity may mean a property to be deformed when a load such as extension and compression is applied and to return to its original form when the load is removed. Meanwhile, the deformation by the elasticity may include a deformation to return to its original form by a restoration force after being deformed by another factor, rather than a load. For instance, the deformation part 220 may be formed by a material having elasticity such as silicon and urethane.

The plurality of segments 230 are formed to cover the deformation part 220 in a state that they are adjacent to each other and to expose at least part of the deformation part 220 to the outside in a state that they are spaced from each other. Here, it is preferable to form the plurality of segments 230 to entirely cover the deformation part 220 without exposing any part to the outside.

And the plurality of segments 230 enclosing the band unit 210, wherein the plurality of segments 230 are movable to cover or expose a portion of the deformation part 220, the portion covered by the plurality of segments 230 when all of the plurality of segments 230 are arranged to be adjacent to each other and the portion is exposed when at least two of the plurality of segments 230 are arranged to be spaced apart from each other.

And the plurality of segments 230 are configured to receive a restoration force by elasticity of the deformation part 220 by a fixing part (not shown) provided in the mobile terminal 200. Specifically, the fixing part may be disposed between facing surfaces of the deformation part 220 and the plurality of segments 230 and configured to fix the deformation part 220 and the plurality of segments 230. For instance, the fixing part may be formed of a material to adhere different things to each other, or may be implemented to have a mechanical structure which can fixedly couple the deformation part 220 and the plurality of segments 230 with each other.

According to the fixing structure of the deformation part 220 and the plurality of segments 230, there is an advantage in that it is possible to easily implement movement of the plurality of segments 230 by receiving a restoration force by elasticity from the deformation part 220, without an additional external force.

Further, as shown in FIG. 2, the plurality of segments 230 are formed along a lengthwise direction D1 of the band unit 210 in a divided manner so as to be adjacent to each other or to be spaced from each other in the divided state, thereby selectively exposing at least part of the deformation part 220. Further, the plurality of segments 230 may also be formed so as to be adjacent to each other or to be spaced from each other in a divided state in a widthwise direction of the band unit 210, not in the lengthwise direction D1. Further, each of the plurality of segments 230 is shown in FIG. 2 to have one surface facing a users hand in a rectangular shape, but not limited thereto. That is, the plurality of segments 230 may be formed to have a concavo-convex shape corresponding to each other.

Meanwhile, though not shown, the plurality of segments 230 may be formed of a light-transmissible material which permits light to transmit therethrough. According to the aforementioned structure, it is possible to implement a mobile terminal in which the deformation part 220 or the module unit 240 can be seen from the outside even in a state that the plurality of segments are disposed to be adjacent to each other.

The module unit 240 is configured to execute specific functions which can be implemented in the mobile terminal 200, and disposed such that at least part of the module unit 240 may be accommodated in the deformation part 220 by being selectively exposed by the plurality of segments 230. Here, the module unit 240 may be configured to execute the specific functions in an accommodated state in the deformation part 220 without being exposed to the outside of the deformation part 220, and may be configured to execute the specific functions in a state that at least part thereof has been exposed to any one surface of the deformation part 220.

Referring to FIGS. 2 and 3, the mobile terminal 200 may further include a body part 250 which contains therein elements for implementing the mobile terminal 200. The specific structure of the body part 250 will be described hereinafter with reference to FIGS. 15 through 17.

According to the mobile terminal 200 as described hereinbefore, since a user can selectively expose and use the corresponding module unit 240 when he/her desires to use a specific function, it is possible to enhance a durability of the mobile terminal 200 by protecting the module unit 240 from an external environment. Further, since the module unit 240 is not exposed to the outside in an ordinary state by the plurality of segments 230, as shown in FIG. 2, it is possible to implement a mobile terminal 200 of a new type and design unlike the conventional one.

Hereinafter, the band unit 210 will be additionally described with reference to FIGS. 4A and 4B.

Figure 4A:
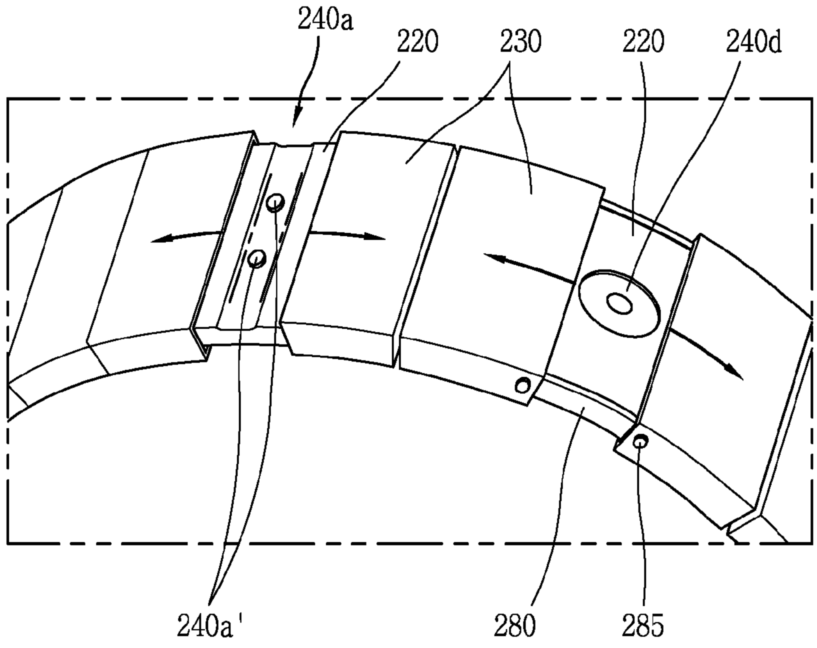
FIG. 4A is an enlarged perspective view illustrating a band unit of FIG. 2.
Figure 4B:
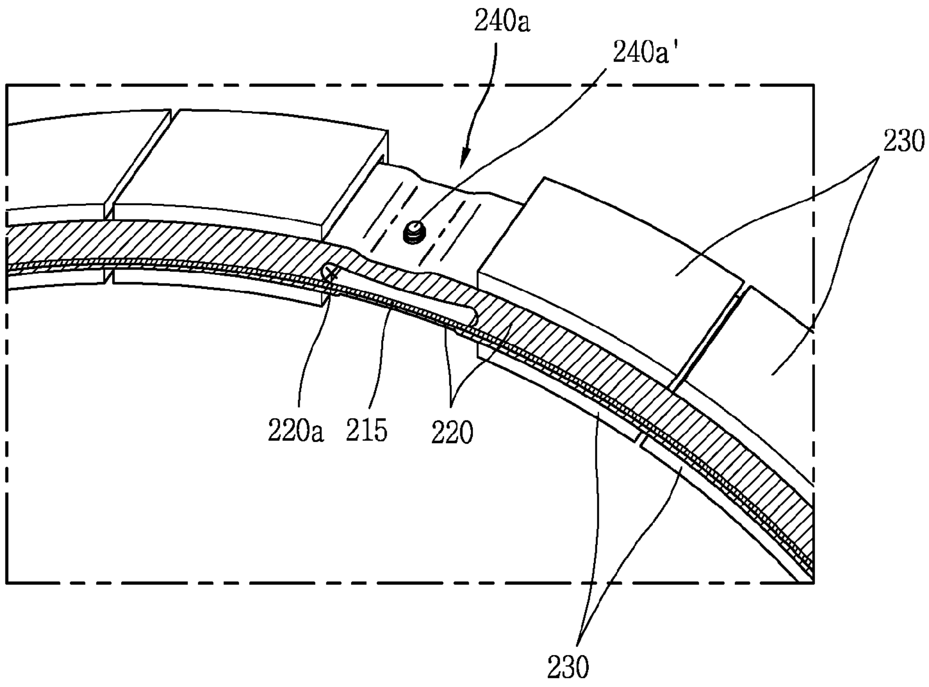
FIG. 4B is a cross-sectional view illustrating one region of the band unit of FIG. 2.

FIG. 4A is an enlarged perspective view illustrating the band unit 210 of FIG. 2, and FIG. 4B is a cross-sectional view illustrating one region of the band unit 210 of FIG. 2.

Referring to FIGS. 4A and 4B, the module unit 240 (refer to FIG. 2) may include a power connection part **240*a* which is configured to receive a power from the outside, and the power connection part 240*a* may include a power terminal 240*a*' which is configured to be electrically connected to an external power source. Here, at least part of the power terminal 240*a*' may be disposed to be exposed to any one surface of the deformation part 220. The power terminal 240*a*' may preferably be disposed to be exposed to one surface opposite to part of a users body where the band unit 210 is fastened, thereby capable of easily contacting an external power source. But the power terminal 240*a*' may be disposed to be exposed to another surface of the deformation part 220**.

Meanwhile, as shown in FIG. 4A, the module unit 240 may include a camera unit **240*d* disposed to be exposed to any one surface of the deformation part 220 except one surface facing part of the users body where the band unit 210** is fastened, and configured to receive an image signal (data).

Meanwhile, the mobile terminal 200 may further include a flexible circuit board 215.

The flexible circuit board 215 may be electrically connected to the module unit 240 and disposed in the deformation part 220. Referring to FIG. 4B, the flexible circuit board 215 may be configured not to be directly exposed to one surface of the deformation part 220 in a state that the plurality of segments 230 are spaced from each other.

Further, the deformation part 220 may include an accommodation space **220*a***.

The accommodation space **220*a* of the deformation part 220 may be provided as an empty space of a preset size in which one region of the flexible circuit board 215 may be accommodated in a rolled or overlapped state by being folded, as the plurality of segments 230 are spaced from each other or adjacent to each other. There is schematically shown in FIG. 4B an example of the accommodation space 220*a*, but the shape of the accommodation space 220** is not limited thereto.

Further, referring to FIG. 4A, the mobile terminal 200 may further include a frame 280 and a switch unit 285 for fixing the plurality of segments 230 which are moving to a preset position. The specific structure of the frame 280 and the switch unit 285 will be described with reference to FIGS. 9A through 12B.

Hereinbelow, an example of a power supply through the power connection part 240*a* from an external power source will be described in more detail with reference to FIGS. 5 through 8.

Figure 5:
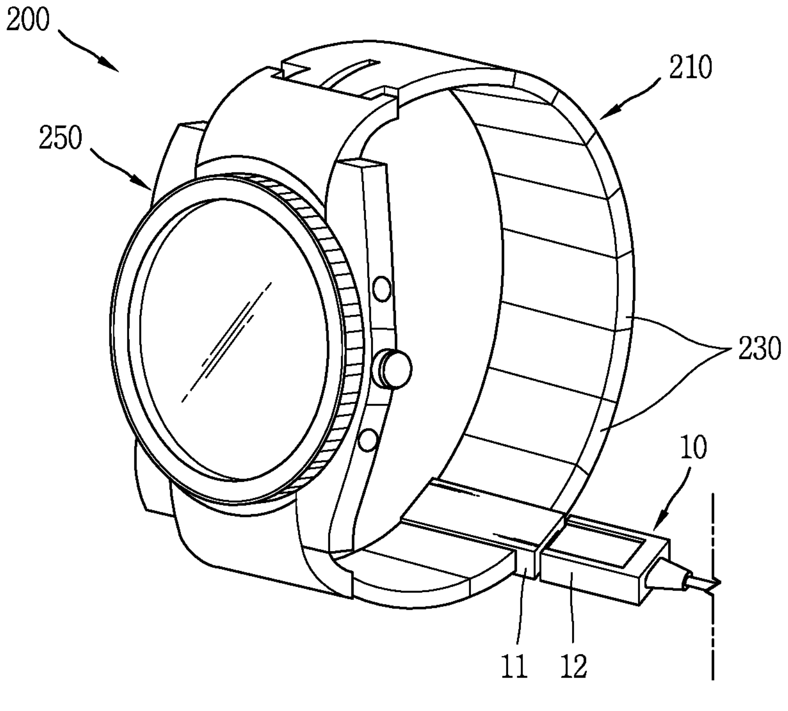
FIG. 5 is a perspective view illustrating a state that a charging kit is connected to a power connection part of FIG. 4A.
Figure 6A:
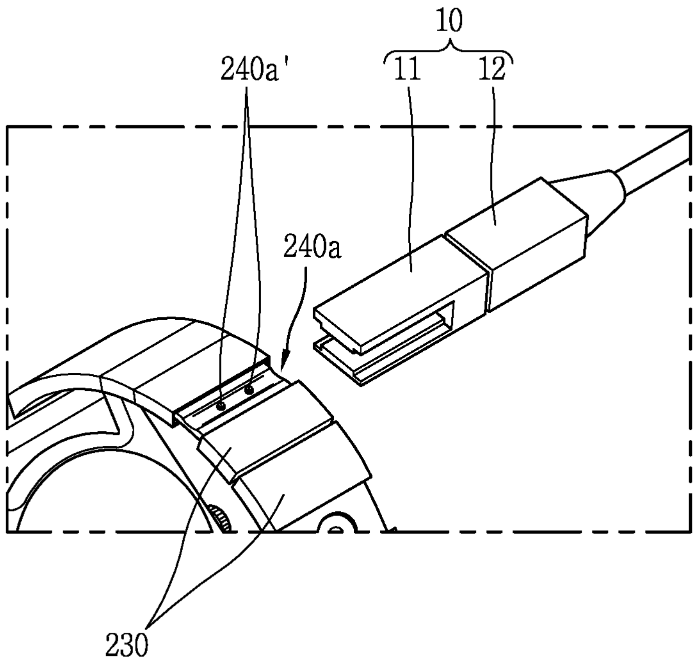
FIGS. 6A and 6B are perspective views illustrating states before and after the charging kit of FIG. 5 is connected to the power connection part, respectively.
Figure 6B:
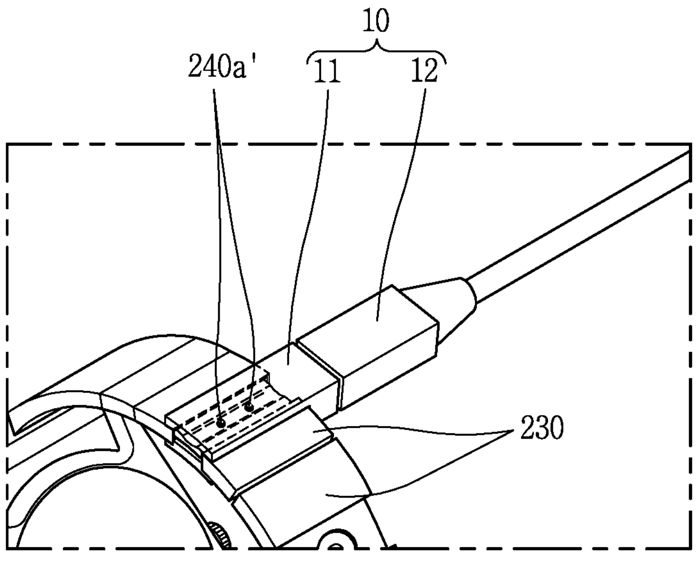
Figure 7:
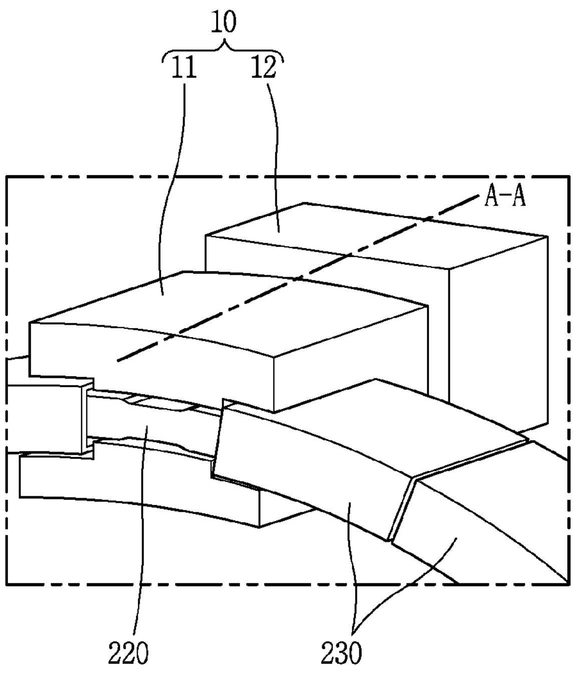
FIG. 7 is a perspective view illustrating a connected state between the charging kit and the power connection part of FIG. 6B, viewed from a side.
Figure 8:
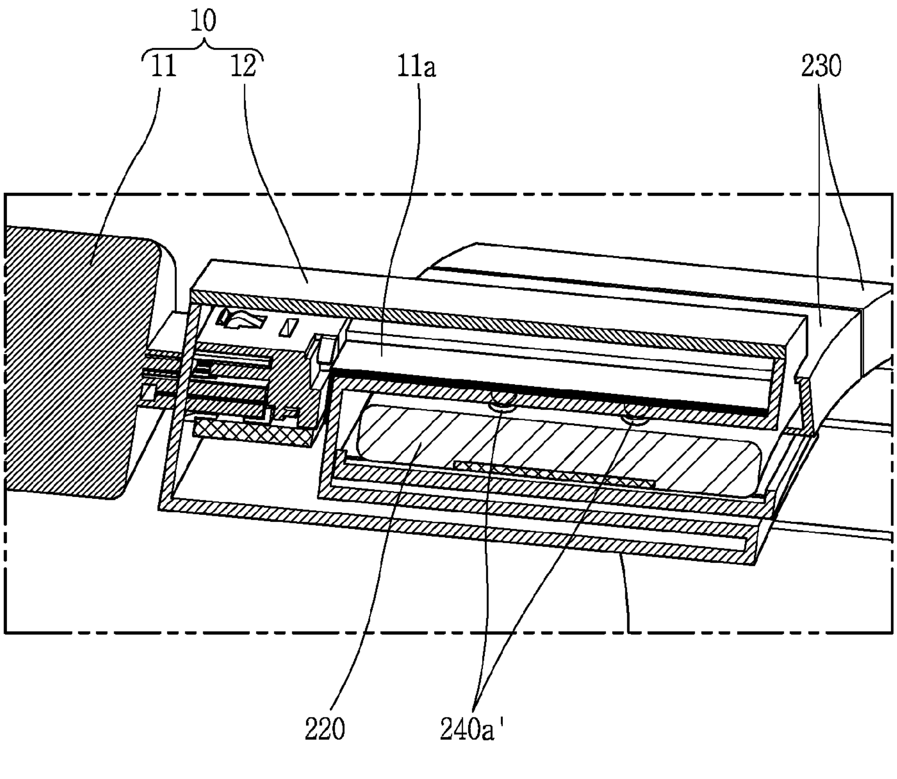
FIG. 8 is a cross-sectional view taken along line A-A in FIG. 7.

FIG. 5 is a perspective view illustrating a connected state of a charging kit 10 to the power connection part 240*a* of FIG. 4A, FIGS. 6A and 6B are perspective views illustrating states before and after the charging kit 10 of FIG. 5 is connected to the power connection part 240*a*. FIG. 7 is a perspective view illustrating a connected state between the charging kit 10 and the power connection part 240*a* of FIG. 6, viewed from a side, and FIG. 8 is a cross-sectional view taken along line A-A in FIG. 7.

Referring to FIGS. 5 through 8, the power connection part 240*a* is exposed to the outside in a state that the plurality of segments 230 are spaced from each other, as shown in FIG. 6A. Thereafter, as shown in FIG. 6B, the power connection part 240*a* can receive a power required to drive the mobile terminal 200 by connecting the power terminal 240*a*' to the charging kit 10 which is inserted from a side surface of the band unit 210. The power supplied from the outside may charge a battery (not shown) provided at the mobile terminal 200.

Here, the charging kit 10 may include a first body 11 directly and electrically connected to the power connection part 240*a* and a second body 12 configured to connect the first body 11 to an external power source and transmit the power to the first body 11. As shown in FIG. 8, the first body 11 is formed of a conductive material and may include a contact region 11*a* directly contacting the power terminal 240*a'*.

As describe hereinabove, there is an advantage in that it is possible to supply a power required to drive the mobile terminal 200 even in a state that the mobile terminal 200 is worn on any one part of a users body.

Hereinafter, the structure of the frame 280 and the switch unit 285 provided at the mobile terminal 200 according to the present invention will be described with reference to FIGS. 9A through 12B.

Figure 9A:
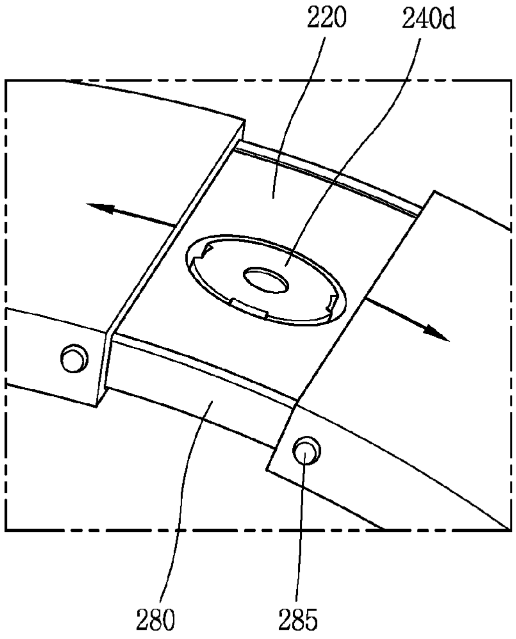
FIG. 9A is a perspective view illustrating an example of a frame and a switch unit included in the mobile terminal according to one embodiment of the present invention.
Figure 9B:
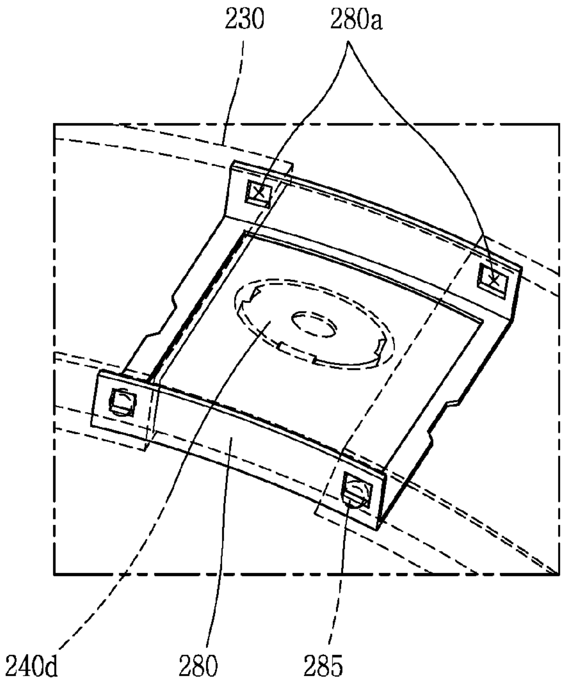
FIG. 9B is a perspective view illustrating an arrangement of the frame of FIG. 9A.
Figure 10:
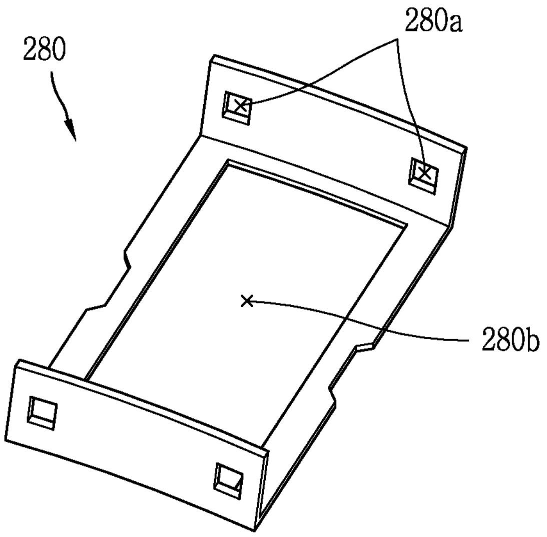
FIG. 10 is a perspective view illustrating the frame of FIG. 9A.
Figure 11:
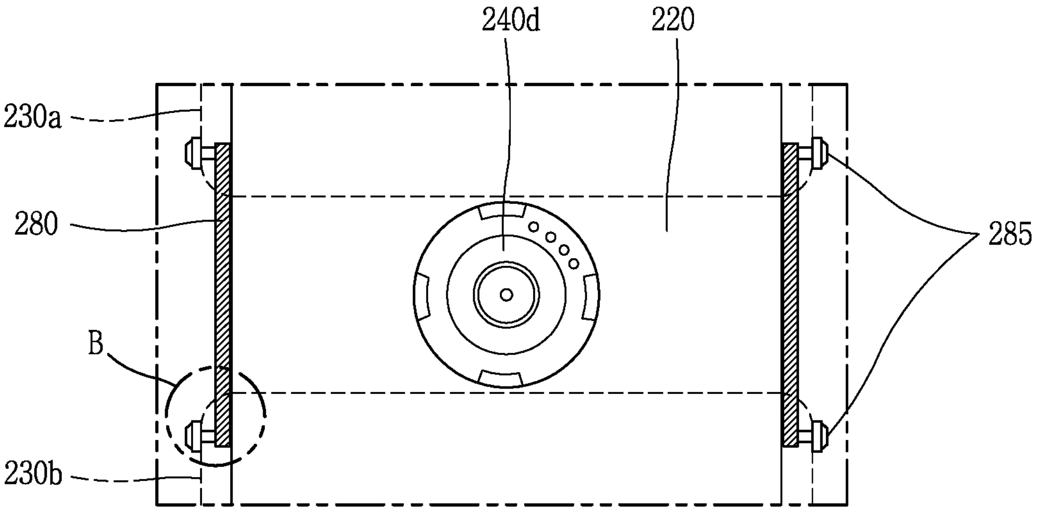
FIG. 11 is a plane view illustrating the frame and switch unit of FIG. 9A.
Figure 12A:
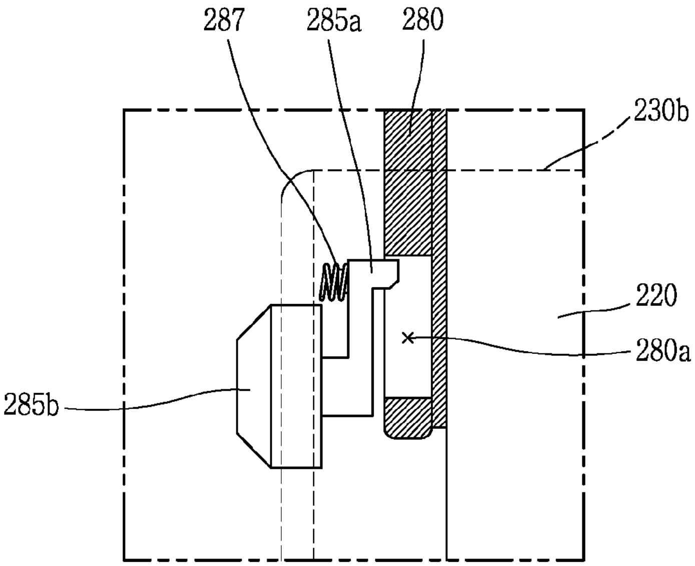
FIG. 12A is an enlarged view of "B" of FIG. 11 illustrating a coupled state of a hook of the switch unit to a through hole of the frame.
Figure 12B:
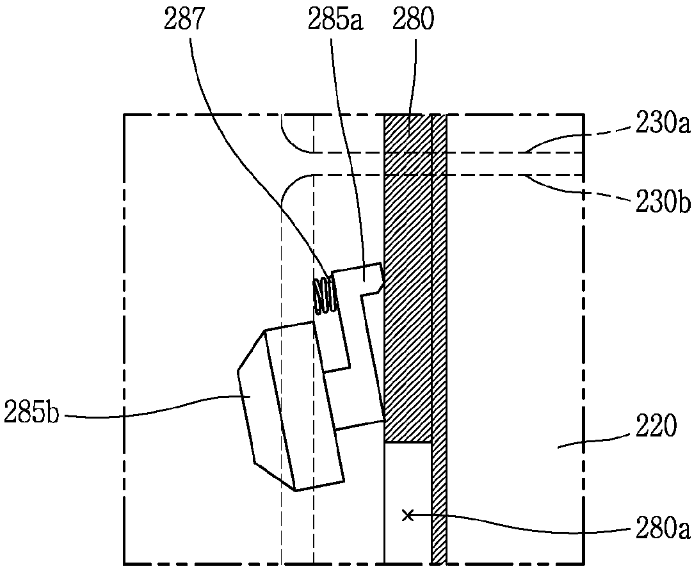
FIG. 12B is a view illustrating a released state of the coupling between the through hole and the hook of FIG. 12A.

FIG. 9A is a perspective view illustrating an example of the frame 280 and switch unit 285 included in the mobile terminal 200 according to one embodiment of the present invention, FIG. 9B is a perspective view illustrating an arrangement structure of the frame 280 of FIG. 9A; FIG. 10 is a perspective view illustrating the frame 280 of FIG. 9A, FIG. 11 is a plane view illustrating the frame 280 and switch unit 285 of FIG. 9A, FIG. 12A is an enlarged view of the portion "B" of FIG. 11 illustrating a state that a hook 285*a* of the switch unit 285 is coupled to a through hole 280*a* of the frame 280, and FIG. 12B is a view illustrating a state that the coupling between the through hole 280*a* and the hook 285*a* of FIG. 12A is released.

Referring to FIGS. 9A through 12B, the mobile terminal 20 may further include the frame 280 and the switch unit 285.

The frame 280 may include a module unit 240 (refer to FIG. 2) having a camera mounting portion 240*d* on which a camera unit is mounted, wherein the frame is coverable or exposable to the outside by the plurality of segments 230. Further, the frame 280 may include an opening type empty space 280*b* through which a rear surface of the deformation part 220 may be exposed to the outside in a state that the plurality of segments 230 are spaced from each other. Thus, since a rear surface of the deformation part 220 is exposed to the outside even in a state that the module unit 240 is mounted on the frame 280, there is an advantage in that rear surfaces of the deformation part 220 and the module unit 240 which are exposed to the outside can be utilized.

The switch unit 285 is mounted to each of the plurality of segments 230 and coupled to the frame 280 in a state that the plurality of segments 230 are spaced from each other, thereby limiting movement of the plurality of segments 230. For instance, the coupling between the frame 280 and the switch unit 285 is executed by a first magnetic part (not shown) formed on one region of the frame 280 and a second magnetic part (not shown) formed on one region of the switch unit 285 and exhibiting an opposite polarity to the first magnetic part.

Further, the frame 280 may include through holes 280*a* which are disposed at both side surfaces to correspond to each other, as shown in FIG. 10, and the switch unit 285 may include hooks 285*a* to be coupled to the through holes 280*a* of the frame 280 in a state that the plurality of segments 230 are spaced from each other so as to maintain the state of the plurality of segments 230.

Further, the mobile terminal 200 may further include a spring unit 287.

One side of the spring unit 287 may be supported by an inner surface of the plurality of segments 230, and the spring unit 287 may be configured to elastically transform the hook 285*a* of the frame 285 toward the frame 280, as shown in FIGS. 12A and 12B. When the first segment 230*a* and the second segment 230*b* are moved to be spaced from each other, as shown in FIG. 12A, coupling between the hook 285*a* and the through hole 280*a* can be performed by an elastic force of the spring unit 287 without an additional operation. And a button 285*b* for user operation can be configured in the hook 258*a*.

Hereinafter, the display unit 240*c* provided at the module unit 240 according to the present invention will be described in detail with reference to FIGS. 13 and 14.

The module unit 240 (refer to FIG. 2) may include a display unit 240*c*.

The display unit 240*c* is disposed at one surface of the deformation part 220 and configured to output visual information. The display unit 240*c* may output different visual information from a main display unit (not shown) mounted to a body part 250 so that additional information may be provided to a user. Here, when the plurality of segments 230 are disposed to be adjacent to each other, the display unit 240*c* can be protected from external harmful environments or elements by the plurality of segments 230.

Further, the display unit 240*c* may be formed of an organic light emitting diode (OLED).

Hereinafter, the body unit 250, the connection pin 260 and the contact terminal part 270 provided at the mobile terminal 200 according to the present invention, will be described in detail with reference to FIGS. 15 through 17.

Figure 13:
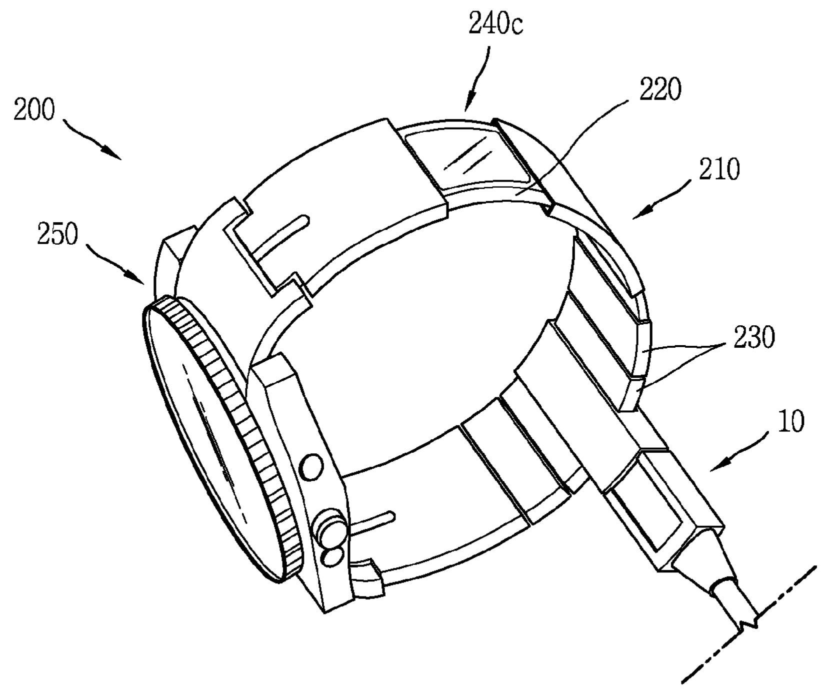
FIG. 13 is a perspective view illustrating an example of the mobile terminal in which a module unit includes a display unit.
Figure 14:
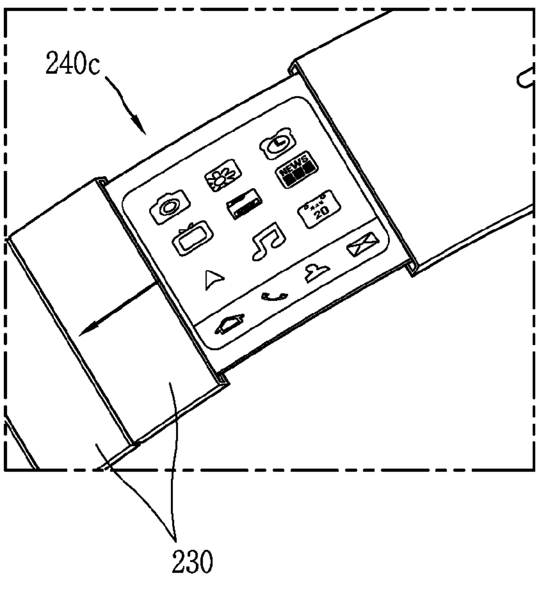
FIG. 14 is a schematic view illustrating the display unit of FIG. 13 in an enlarged manner.
Figure 15:
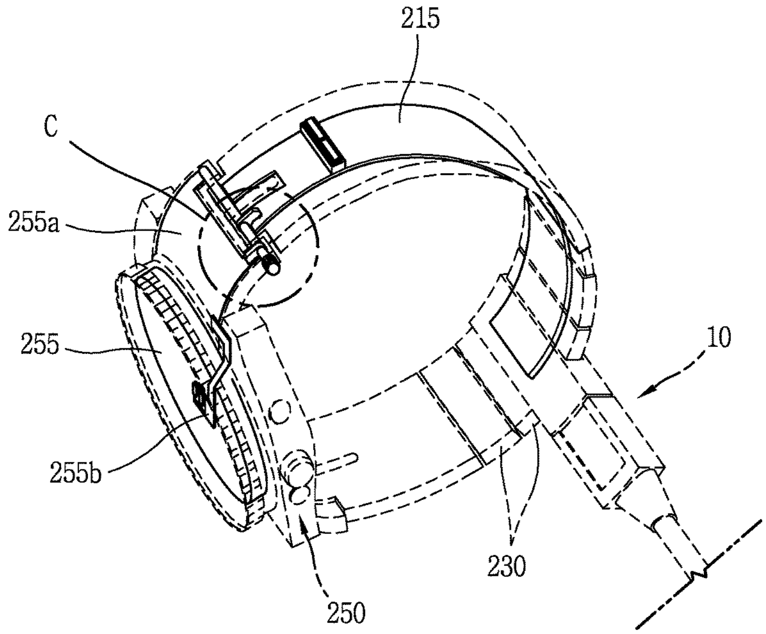
FIG. 15 is a schematic view illustrating an inner structure of the mobile terminal of FIG. 13.
Figure 16:
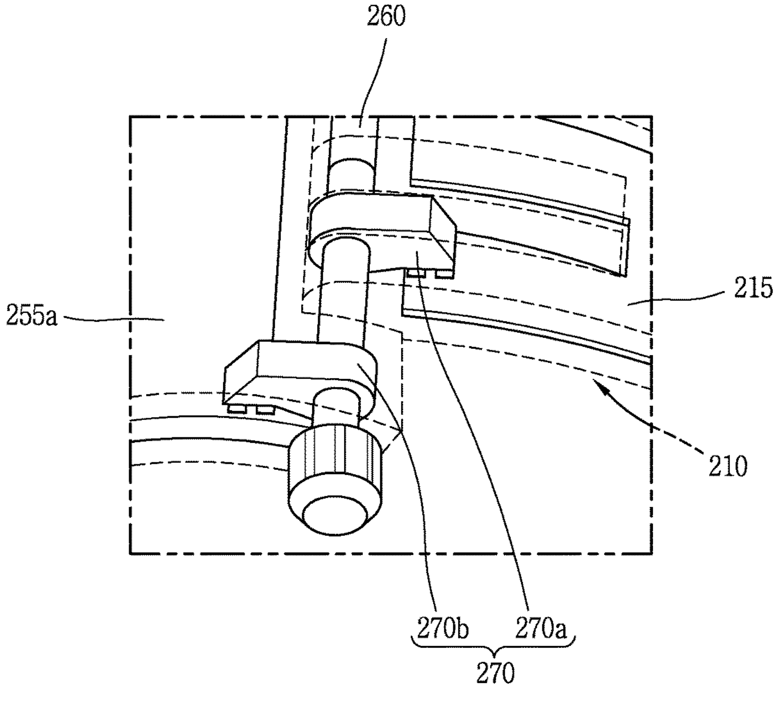
FIG. 16 is a schematic view illustrating a portion "C" in FIG. 15 in an enlarged manner.
Figure 17:
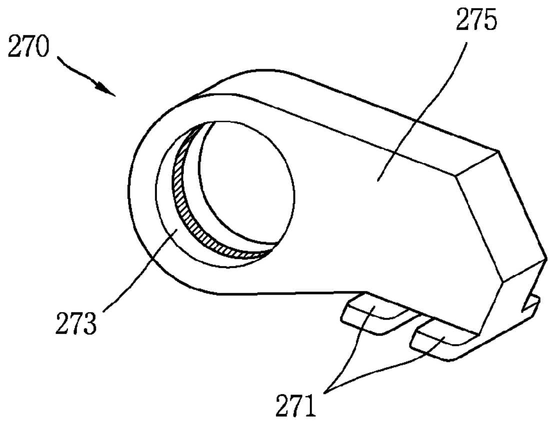
FIG. 17 is a perspective view illustrating a contact terminal of FIG. 16.

FIG. 15 is a schematic view illustrating an inner structure of the mobile terminal 200 of FIG. 13, FIG. 16 is a schematic view illustrating part "C" in FIG. 15 in an enlarged manner, and FIG. 17 is a perspective view illustrating a contact terminal part 270 of FIG. 16.

Referring to FIGS. 15 through 17, the mobile terminal 200 may further include the body part 250, the connection pin 260 and the contact terminal part 270.

The body part 250 may include a case (for instance, a frame, a housing, a cover, and the like) forming an external appearance, and may be configured such that structural elements of the mobile terminal 200 can be disposed on one region thereof. Further, the body part 250 may be mechanically and electrically coupled to the band unit 210.

The connection pin 260 may be formed of a conductive material through which a current may flow and configured to rotatably connect the body part 250 and the band unit 210 (refer to FIG. 2) with each other. The connection pin 260 may be formed to a hollow rod shape, as shown.

The contact terminal part 270 may be rotatably coupled to the connection pin 260 and configured to electrically connect the flexible circuit board 215 to the main circuit board 255 provided to the body part 250. For instance, a connection circuit board 255*a* may be disposed between the main circuit board 255 and the flexible circuit board 215, and the contact terminal part 270 may be configured to electrically connect the flexible circuit board 215 and the connection circuit board 255*a* with each other. Here, the mobile terminal 200 may further include a connection terminal 255*b* which electrically connects the connection circuit board 255*a* and the main circuit board 255 with each other.

Further, the contact terminal part 270 may include a first contact terminal 270*a* configured to electrically connect the flexible circuit board 215 and the connection pin 260 with each other, and a second contact terminal 270*b* configured to electrically connect the main circuit board 255 and the connection pin 260 with each other. Here, the contact terminal part 270 may include a first portion 271 electrically connected to a circuit board, a second portion 273 rotatably contacting the connection pin 260, and a housing 275 forming a body of the first and second portions 271 and 273.

According to the structure of the aforementioned connection pin 260 and the contact terminal part 270, it is possible to stably maintain a mechanical and electrical coupling between the body part 250 and the band unit 210, even when a movement of the band unit 210 is continuously generated in a state that the mobile terminal 200 is worn on any part of a users body.

Hereinafter, a port part 240*b* provided at the module unit 240 will be described in detail with reference to FIG. 18.

Figure 18:
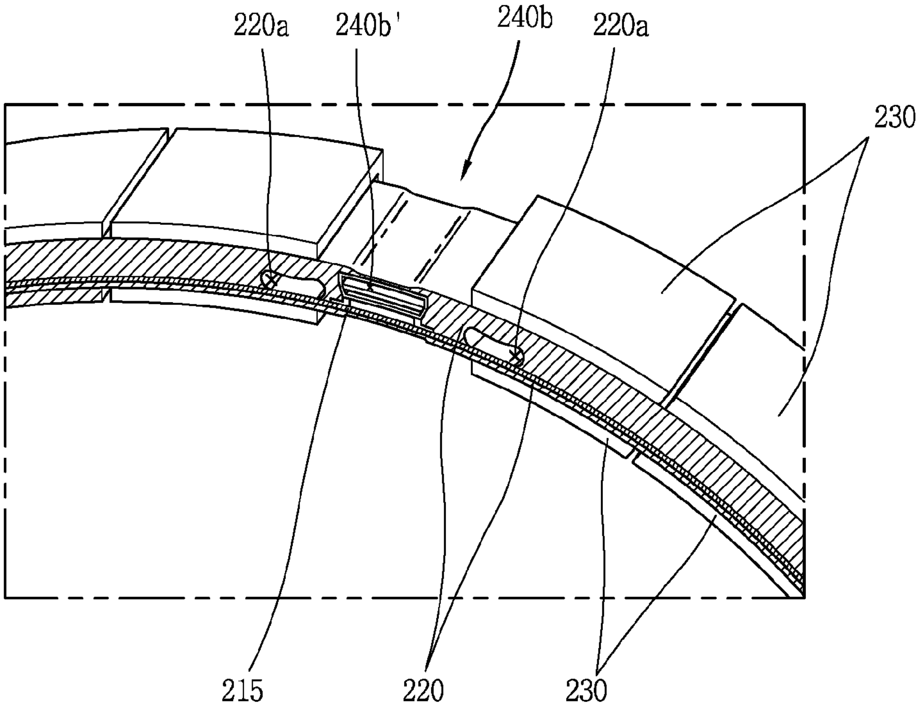
FIG. 18 is a perspective view illustrating an example of the mobile terminal in which the module unit includes a port part.

FIG. 18 is a perspective view illustrating an example of the mobile terminal 200 in which the module unit 240 includes a port part 240*b*.

Referring to FIG. 18, the module unit 240 (refer to FIG. 2) may include a port part 240*b*.

The port part 240*b* is electrically connected to an external device (not shown), and may be configured such that at least one of a power and a data signal is applied therethrough. Further, the port part 240*b* may include a receptacle region 240*b*' in which the external device is inserted, and similarly to the interface unit 160 as shown in FIG. 1, may include at least one of a wire/wireless headset port, an external charger port, a wire/wireless data port, a memory card port, a port for connecting a device provided with an identification module thereto, and audio I/O (input/output) port, a video I/O (input/output port), or an ear phone port.

Further, the port part 240*b* is preferably disposed at a side surface of the deformation part 220 in an exposed manner to be easily connected to an external device, as shown in the drawings, but may be disposed at any surface, rather than the side surface of the deformation part 220.

Further, the deformation part 220 may include an accommodation space 220*a* in which one region of the flexible circuit board 215 may be accommodated in a rolled or overlapped state by being folded.

The accommodation space 220*a* may be formed as an empty space of a predetermined size in which one region of the flexible circuit board 215 may be accommodated in a rolled or overlapped state by being folded, as the plurality of segments 230 are spaced from each other or adjacent to each other. FIG. 4B schematically shows an example of the accommodation space 220*a*, but the shape of the accommodation space 220*a* is not limited thereto.

Hereinafter, a watch-type mobile terminal 300 according to another embodiment of the present invention will be explained in more detail with reference to FIG. 19.

Figure 19:
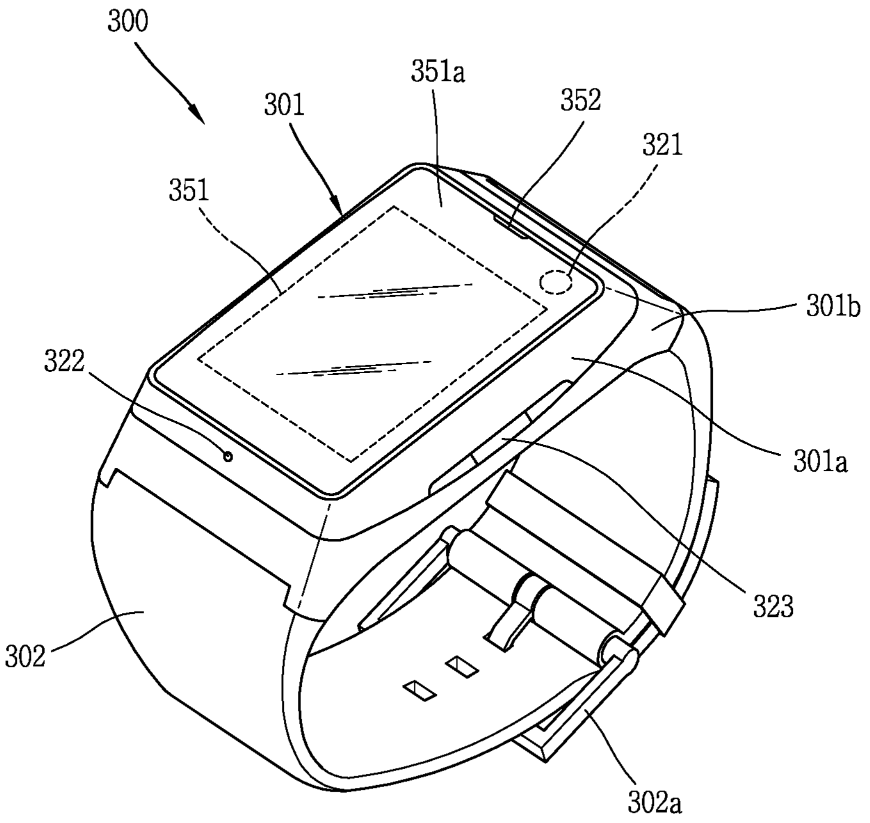
FIG. 19 is a perspective view illustrating an example of a watch-type mobile terminal according to another embodiment of the present invention.

FIG. 19 is a perspective view illustrating one example of a watch-type mobile terminal 300 in accordance with another exemplary embodiment.

As illustrated in FIG. 19, the watch-type mobile terminal 300 includes a main body 301 with a display unit 351 and a band 302 connected to the main body 301 to be wearable on a wrist. In general, mobile terminal 300 may be configured to include features that are the same or similar to that of mobile terminal 100 of FIG. 1.

The main body 301 may include a case having a certain appearance. As illustrated, the case may include a first case 301*a* and a second case 301*b* cooperatively defining an inner space for accommodating various electronic components. Other configurations are possible. For instance, a single case may alternatively be implemented, with such a case being configured to define the inner space, thereby implementing a mobile terminal 300 with a uni-body.

The watch-type mobile terminal 300 can perform wireless communication, and an antenna for the wireless communication can be installed in the main body 301. The antenna may extend its function using the case. For example, a case including a conductive material may be electrically connected to the antenna to extend a ground area or a radiation area.

The display unit 351 is shown located at the front side of the main body 301 so that displayed information is viewable to a user. In some embodiments, the display unit 351 includes a touch sensor so that the display unit can function as a touch screen. As illustrated, window 351*a* is positioned on the first case 301*a* to form a front surface of the terminal body together with the first case 301*a*.

The illustrated embodiment includes audio output module 352, a camera 321, a microphone 322, and a user input unit 323 positioned on the main body 301. When the display unit 351 is implemented as a touch screen, additional function keys may be minimized or eliminated. For example, when the touch screen is implemented, the user input unit 323 may be omitted.

The band 302 is commonly worn on the user's wrist and may be made of a flexible material for facilitating wearing of the device. As one example, the band 302 may be made of fur, rubber, silicon, synthetic resin, or the like. The band 302 may also be configured to be detachable from the main body 301. Accordingly, the band 302 may be replaceable with various types of bands according to a user's preference.

In one configuration, the band 302 may be used for extending the performance of the antenna. For example, the band may include therein a ground extending portion (not shown) electrically connected to the antenna to extend a ground area.

The band 302 may include fastener 302*a*. The fastener 302*a* may be implemented into a buckle type, a snap-fit hook structure, a Velcro® type, or the like, and include a flexible section or material. The drawing illustrates an example that the fastener 302*a* is implemented using a buckle.

As described hereinbefore, according to the mobile terminal of the present invention, the band unit includes a deformation part for accommodating at least part of a module unit configured to execute a specific function, and a plurality of segments formed to cover the deformation part.

Accordingly, when a user wants to use a specific function, it is possible to selectively use a corresponding module unit by exposing it to the outside so that the module unit may be protected from an external environment. This can enhance the durability of the mobile terminal and implement a newly designed mobile terminal as the module unit is not exposed to the outside.

Further, according to the structure of elastically deformable deformation part, it is possible to easily move the plurality of segments so as to be adjacent to each other to cover the deformation part, by providing a restoration force by elasticity to the plurality of segments, without an additional external force.

Further, it is possible to supply a power to the mobile terminal by the power connection part disposed at the band unit, even in a state that the mobile terminal is worn on part of a users body.

Various embodiments may be implemented using a machine-readable medium having instructions stored thereon for execution by a processor to perform various methods presented herein. Examples of possible machine-readable mediums include HDD (Hard Disk Drive), SSD (Solid State Disk), SDD (Silicon Disk Drive), ROM, RAM, CD-ROM, a magnetic tape, a floppy disk, an optical data storage device, the other types of storage mediums presented herein, and combinations thereof. If desired, the machine-readable medium may be realized in the form of a carrier wave (for example, a transmission over the Internet). The processor may include the controller 180 of the mobile terminal.

As the present features may be embodied in several forms without departing from the characteristics thereof, it should also be understood that the above-described embodiments are not limited by any of the details of the foregoing description, unless Alternatively specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A wearable mobile terminal comprising a band unit, wherein the band unit includes:

a deformation part that is elastic and deformable;

a plurality of segments enclosing the band unit, wherein the plurality of segments are movable to cover or expose a portion of the deformation part, the portion covered by the plurality of segments when all of the plurality of segments are arranged to be adjacent to each other and the portion is exposed when at least two of the plurality of segments are arranged to be spaced apart from each other;

a module unit configured to execute a specific function, wherein at least part of the module unit is disposed within the deformation part by being selectively exposed according to an arrangement of the plurality of segments;

a frame on which the module unit is mounted, wherein the frame is coverable by the plurality of segments, and wherein the frame includes a through hole disposed at both side surfaces; and a switch unit mounted to each of the plurality of segments, wherein the switch unit is coupled to the frame in a state that the plurality of segments are spaced from each other to stop moving the plurality of segments, wherein the switch unit includes a hook that is configured to be coupled to the through hole in a state that the plurality of segments are spaced from each other.

2. The mobile terminal of claim 1, further comprising a fixing part disposed between facing surfaces of the deformation part and the plurality of segments, wherein the fixing part couples the deformation part and the plurality of segments with each other.

3. The mobile terminal of claim 1, further comprising a flexible circuit board electrically connected to the module unit and disposed in the deformation part.

4. The mobile terminal of claim 3, wherein the deformation part includes an accommodation part in which an overlapped part of the flexible circuit board is accommodated.

5. The mobile terminal of claim 3, further comprising:

a body part coupled to the band unit;

a connection pin formed of a conductive material and rotatably connecting the body part and the band unit; and a contact terminal part rotatably connected to the connection pin and electrically connecting the flexible circuit board with a main circuit board of the body part.

6. The mobile terminal of claim 5, wherein the contact terminal part includes:

a first contact terminal electrically connecting the flexible circuit board and the connection pin; and a second contact terminal electrically connecting the main circuit board and the connection pin.

7. The mobile terminal of claim 1, wherein:

the module unit includes a power connection part configured to receive power from outside; and the power connection part includes a power terminal electrically connected to an external power source.

8. The mobile terminal of claim 7, wherein at least part of the power terminal is exposed to one surface of the deformation part.

9. The mobile terminal of claim 1, wherein:

the module unit includes a port part electrically connected to an external device; and the module unit is configured to enable application of at least one of a power or a data signal through the module unit.

10. The mobile terminal of claim 9, wherein the port part is disposed at a side surface of the deformation part in an exposed manner.

11. The mobile terminal of claim 1, wherein:

the module unit includes a display disposed at one surface of the deformation part; and the display is configured to output visual information.

12. The mobile terminal of claim 11, wherein the display is formed by an organic light emitting diode (OLED).

13. The mobile terminal of claim 1, wherein:

the module unit includes a camera disposed at a surface of the deformation part, the surface excluding a surface facing a user's wrist; and the camera is configured to receive image data.

14. The mobile terminal of claim 1, wherein at least part of the plurality of segments is formed of a light-transmissible material.

15. The mobile terminal of claim 1, further comprising a spring unit having one end supported on an inner surface of the plurality of segments, wherein the spring unit is configured to elastically force the hook toward the frame.

16. The mobile terminal of claim 1, wherein the frame is shaped to form an empty space through which a rear surface of the deformation part is exposed in the state that the plurality of segments are spaced from each other.

* * * * *